(12) United States Patent
Sakata et al.

(10) Patent No.: US 6,436,550 B2
(45) Date of Patent: *Aug. 20, 2002

(54) SINTERED COMPACT AND METHOD OF PRODUCING THE SAME

(75) Inventors: Masaaki Sakata; Shoji Takahashi; Kenichi Shimodaira, all of Nagano-ken (JP)

(73) Assignee: Injex Corporation, Nagano (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/918,758

(22) Filed: Aug. 25, 1997

(30) Foreign Application Priority Data

Aug. 23, 1996 (JP) .............................. 8-222552

(51) Int. Cl.[7] ..................... B32B 15/16; H01L 23/373; C22C 1/04; B22F 1/00
(52) U.S. Cl. ..................... 428/553; 428/664; 428/665; 428/673; 75/245; 75/247; 75/248; 257/675; 257/706
(58) Field of Search ................... 257/706, 675; 428/546, 553, 673; 420/429, 432, 501; 75/248, 247, 245; 426/665, 664

(56) References Cited

U.S. PATENT DOCUMENTS

| 3,833,410 | A | * | 9/1974 | Ang et al. ................... 117/227 |
| 4,954,170 | A | * | 9/1990 | Fey et al. ..................... 75/229 |
| 4,988,386 | A | | 1/1991 | Oenning et al. .............. 75/247 |
| 5,167,697 | A | * | 12/1992 | Koumura et al. ............. 75/247 |
| 5,732,323 | A | * | 3/1998 | Nyrhila .......................... 419/2 |
| 5,783,860 | A | * | 7/1998 | Jeng et al. ................... 257/675 |
| 5,886,269 | A | * | 3/1999 | Kai et al. ...................... 75/245 |
| 5,886,407 | A | * | 3/1999 | Polese et al. ............... 257/706 |

FOREIGN PATENT DOCUMENTS

| JP | 4-49642 | * | 2/1992 |
| JP | 6-33104 | * | 2/1994 |

OTHER PUBLICATIONS

Derwent Abstract for JP09025525A, Jan. 1997.*

* cited by examiner

Primary Examiner—John J. Zimmerman
(74) Attorney, Agent, or Firm—Bell, Boyd & Lloyd LLC

(57) ABSTRACT

A highly reliable sintered compact which can be readily and safely produced, and a method for producing such sintered compact are provided. The sintered compact is preferably formed into a heat sink 1 which comprises a heat sink main body 2. The heat sink main body 2 comprises a substrate 3, a plurality of projections 4 integrally formed with the substrate 3 on its heat dissipation surface, and a molded frame 5 integrally formed with the substrate 3 to surround the projections 4. On each corner of the substrate 3 is formed a circular molded hole 6. The opposite surface of the substrate 3 is formed into a contacting surface which is adapted to be in contact with the heat generating semiconductor chip, and this contacting surface is surface treated, for example, by plating. The sintered compact is produced from metal powders, and it comprises at least one metal selected from tungsten and molybdenum and 2 to 50% by weight of silver. The sintered compact further comprises not more than 10% by weight of a transition metal.

21 Claims, 2 Drawing Sheets

SINTERED COMPACT AND METHOD OF PRODUCING THE SAME

BACKGROUND OF THE INVENTION

Field of the Invention

This invention relates to a heat sink which is formed from a metal sintered compact produced by sintering an injection molded body prepared from metal powders. This invention also relates to a process for producing a metal sintered compact such as a heat sink.

A semiconductor chip used for CPU or the like generates heat in its operation, and therefore, a heat sink or a heat dissipater is attached to such semiconductor chip for facilitating the heat dissipation or radiation.

Heat sinks are generally produced from tungsten (W)-based metal materials since heat sinks must have a small coefficient of expansion to avoid the cracking of the semiconductor chip by the temperature difference generated between the heat sink and the semiconductor chip formed of silicon (Si).

Recently, use of a W-Cu alloy is also contemplated as a material for heat sinks. The W-Cu alloy is an alloy wherein copper (Cu) having a good thermal conductivity is added to tungsten to thereby improve the heat dissipation properties.

Conventionally, metal products such as heat sink have been produced by a casting. However, it has been difficult to produce a small precision metal product of intricate shape by such casting. Therefore, such casting method is inappropriate for producing a heat sink, because a heat sink inevitably has an intricate geometry for facilitating heat radiation.

In view of such situation, metal injection molding (MIM) has been proposed for use in place of the casting. In MIM, the metal powder is mixed with an organic binder, and then the mixture is injection molded to produce a green body. Such a green body is then sintered in a sintering furnace to produce a sintered compact.

A metal sintered compact of a W-Cu alloy, however, suffers from the following drawbacks.

(1) The W-Cu sintered compact exhibits a low sintered density, namely, it has a high porosity. Therefore, the sintered compact has low strength and therefore it is brittle, so that the sintered compact is likely to break by an impact and the like.

(2) When the surface of the heat sink which is to be in contact with the semiconductor chip is plated with Ag or an alloy thereof, the adhesion of the plated layer with respect to the sintered compact is relatively low, thus leading lifting and peeling off of the plated layer.

Such a relatively low adhesion of the plated layer is believed to be resulted from the properties of the W-Cu alloy. Further, in addition thereto, it is also believed that the plating solution of considerable volume remaining in the pores of the sintered compact of high porosity as described in (1) above affects such relatively low adhesion of the plated layer.

(3) The sintering process requires use of hydrogen gas or an inert gas containing hydrogen gas for the sintering atmosphere. The use of such gas renders the process rather dangerous.

As described above, the metal sintered compact of a W-Cu alloy has been insufficient in reliability due to the reasons stated in (1) and (2) above, and its production was neither easy nor safe due to the reason stated in (3) above.

SUMMARY OF THE INVENTION

In view of the situation as described above, a main object of the present invention is to provide a sintered compact which has a reliable quality and which is easy and safe to produce.

Another object of the present invention is to provide a production process of such sintered compact.

In order to achieve these objects, one aspect of the present invention is directed to a sintered compact for use in a heat dissipater. The sintered compact formed from metal powders and having a metal composition comprising at least one material selected from the group comprising tungsten and molybdenum, and 2 to 50% by weight of silver.

According to the sintered compact, when the sintered compact is used for a heat sink for a semiconductor chip for instance, it is possible to prevent cracks effectively. Further, dissipation of heat is improved due to silver added thereto, and the adhesion of the plating layer is also improved due to use of silver or silver-alloy plating layer.

In the present invention, it is preferred that the sintered compact further comprises not more than 10% by weight of a transition metal. In this case, it is preferred that the transition metal is at least one metal selected from the group comprising Fe, Ni and Co.

By constructing the sintered compact in this way, it is possible to lower the porosity of the obtained metal sintered compact as well as to improve the adhesion of the plated layer. Further, it is also possible to prevent alternation (tarnishing) of the plated layer as well as to lower the sintering temperature.

Further, in the present invention, it is also preferred that the sintered compact further comprises phosphorus. This is effective in lowering the sintering temperature.

In the present invention, a part of the silver content in the sintered compact which is not more than 50% may be substituted with copper. Such a substitution can reduce an amount of use of silver which is an expensive material without changing the characteristics, thereby enabling to reduce manufacturing costs.

Furthermore, it is preferred that the sintered compact according to the present invention has a thermal conductivity of at least 140 $W \cdot m^{-1} \cdot K^{-1}$ at a temperature of 20° C. In this way, it is possible to exhibit excellent heat dissipation ability when it is formed into a heat sink for a semiconductor chip.

Moreover, it is also preferred that the sintered compact according to the present invention has a thermal expansion coefficient of $12 \times 10^{-6}$ $K^{-1}$ or less. In this way, it is possible, when it is used as a heat sink for a semiconductor chip, to prevent that cracks will occur in the semiconductor chip.

In the present invention, it is also preferred that the sintered compact has a porosity of 10% or less. By constructing the sintered compact in this way, it is possible to prevent the mechanical strength thereof from being lowered, so that such sintered compact is difficult to be damaged even if it impact is applied thereto. Therefore, the reliability of the heat sink is improved. Further, the adhesion of plating is also improved.

The sintered compact as described above is preferably used as a heat sink for cooling a semiconductor chip.

In the present invention, it is also preferred that the sintered compact has a contacting surface adapted to contact with a heat generating component, and a coating layer is formed on the contacting surface of the sintered compact. Such a coating layer can give various functions such as a bonding function to the contacting surface.

Preferably, the coating layer is provided for the purpose of providing bonding between the sintered compact and the heat-generating component or assisting such bonding therebetween. In this case, the coating layer is preferably formed into a plated layer.

In this case, the pleated layer is preferably formed from silver or silver alloy. In this way, it is possible to obtain a sintered compact having a desired bonding characteristic and a good thermal conductivity.

Another aspect of the present invention is directed to a method of producing a sintered compact. This method comprises the steps of: [1] producing an injection molded green body according to a metal injection molding; [2] debinding the green body to produce a brown body; and [3] sintering the brown body at a high temperature to produce a sintered compact having a metal composition comprising at least one metal selected from the group comprising tungsten and molybdenum; and 2 to 50% by weight of silver.

According to the method described above, it is possible to easily produce a heat sink for a semiconductor chip which can prevent cracks from being formed in the semiconductor chip and has an excellent heat dissipation ability.

In this method, it is preferred that the sintered compact further comprises not more than 10% by weight of a transition metal. In this case, it is preferred that the transition metal is at least one metal selected from the group comprising Fe, Ni and Co.

By constructing the sintered compact in this way, it is possible to lower the porosity of the obtained metal sintered compact as well as to improve the adhesion of the plated layer. Further, it is also possible to prevent alternation (tarnishing) of the plated layer as well as to lower the sintering temperature.

In this case, it is particularly preferred that the sintered compact further comprises phosphorus. This is effective in lowering the sintering temperature.

Further, in this method, a part of the silver content in the sintered compact which is not more than 50% may be substituted with copper. Such a substitution can reduce an amount of use of silver which is an expensive material without changing the characteristics, thereby enabling to reduce manufacturing costs.

Furthermore, in this method, it is preferred that the debinding process is carried out at a temperature of from 100 to 750° C. for a period of 0.5 to 40 hours. In this way, it is possible to carry out the debinding process more preferably and effectively, thus leading to improvement in the quality of the obtained sintered compact.

Further, in this method, it is also preferred that the sintering process in step (3) is carried out for 10 hours or less. In this way, it is possible to prevent that the productivity is lowered.

Furthermore, in this method, it is also preferred that the sintering process is carried out in a hydrogen-free, non-oxidizing atmosphere. This improves safety during the sintering process.

More over, in this method, it is preferred that the sintered compact produced in step (3) has a contacting surface adapted to be in contact with a heat generating component, and the process further comprises the step of performing a surface treatment to at least the contacting surface of the sintered compact which is adapted to be in contact with the heat-generating component. Such a coating layer can give various functions such as a bonding function to the contacting surface.

In this method, it is preferred that the surface treatment is plating. More preferably, the surface treatment is plating by means of silver or silver-alloy. In this way, it is possible to obtain a sintered compact having a desired bonding characteristic and a good thermal conductivity.

Other objects, structures and effects of the present invention will be apparent from the following description of the invention.

DETAILED DESCRIPTION OF THE INVENTION

Hereinbelow, the sintered compact of the present invention and the method for making such sintered compact are described in detail.

The sintered compact of the present invention is used for a heat dissipater such as a heat sink. Hereinbelow, a description is made with reference to an embodiment of the present invention where the sintered compact of the present invention is applied to a heat sink for cooling a semiconductor chip.

Figure 1:
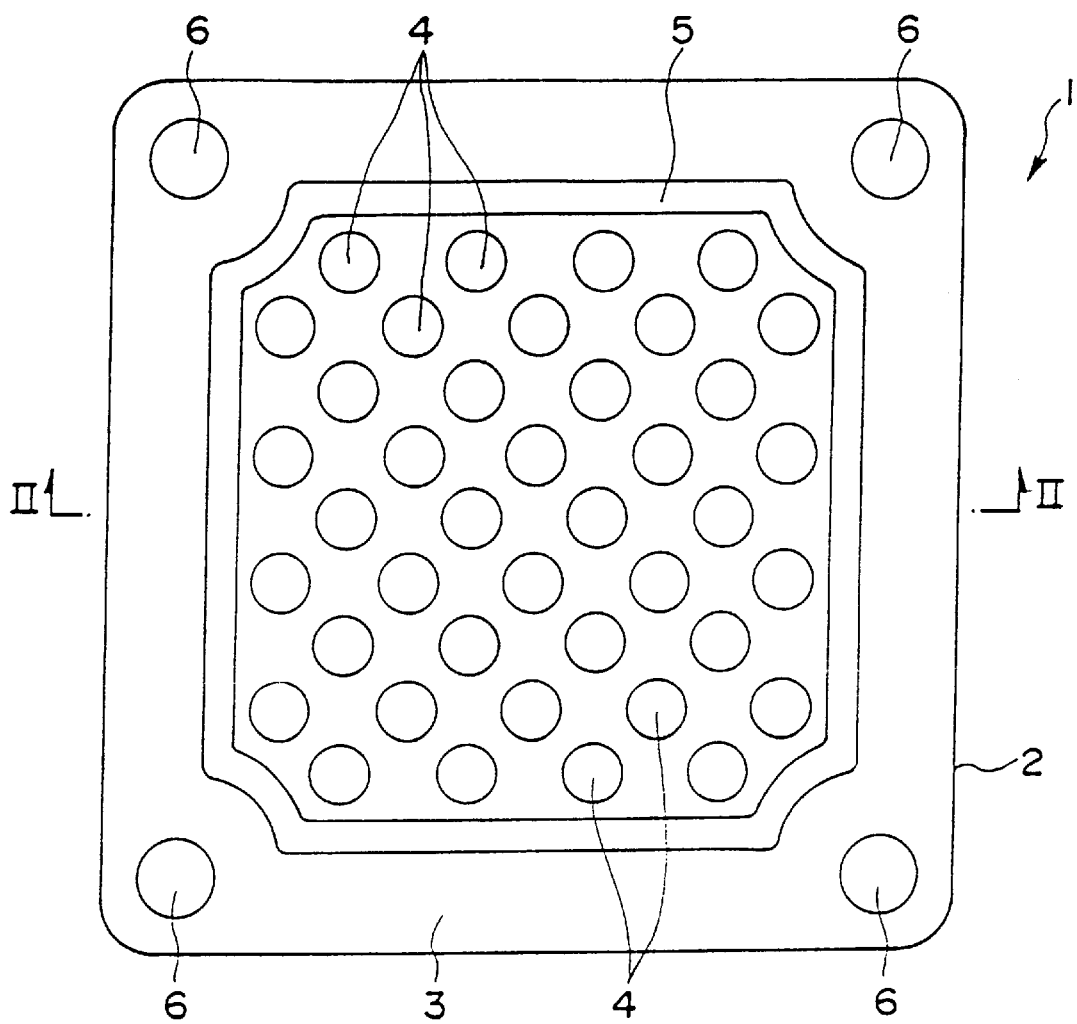
FIG. 1 is a plan view showing a sintered compact (heat sink) according to an embodiment of the present invention.
Figure 2:
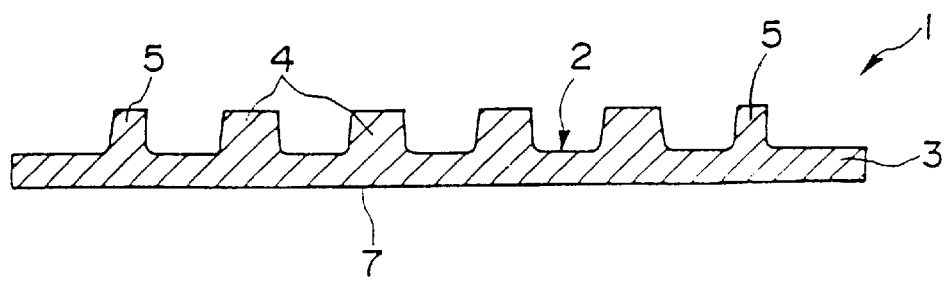
FIG. 2 is a cross-sectional view taken along lines II—II in FIG. 1.
Figure 3:
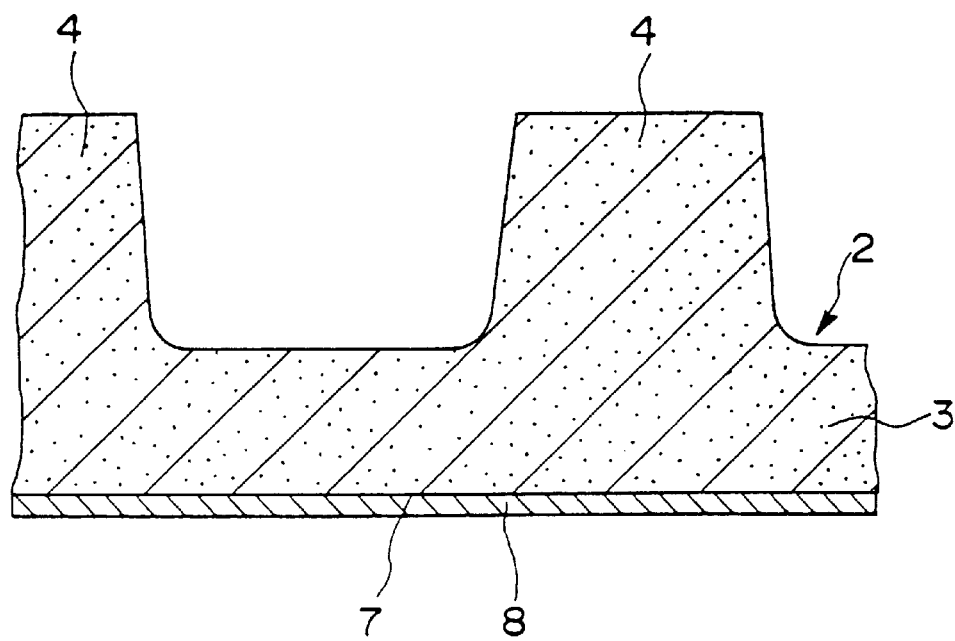
FIG. 3 is a partially exploded view of FIG. 2.
Figure 4:
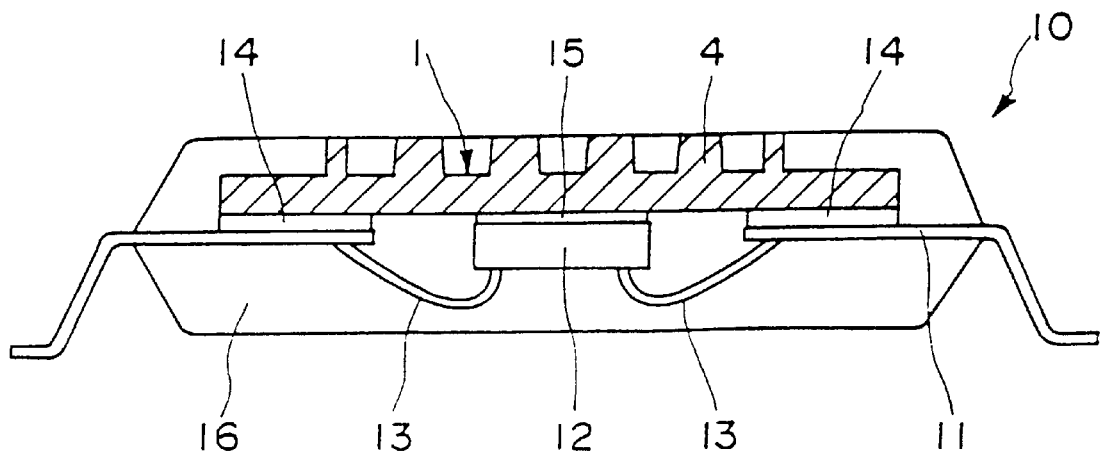
FIG. 4 is a cross-sectional side view of the heat sink of the present invention mounted on an IC package.

FIG. 1 is a plan view showing an embodiment of a heat sink which is constructed from a sintered compact of the present invention (hereinafter, simply referred to as a "heat sink"). FIG. 2 is a cross-sectional view taken along lines II—II in FIG. 1. FIG. 3 is a partially exploded view of FIG. 2. FIG. 4 is a cross-sectional side view of the heat sink mounted in an IC package.

As shown in these drawings, the heat sink 1 comprises a heat sink main body 2 which is constituted from a metal sintered compact having the metal composition as will be described later.

The heat sink main body 2 comprises a substrate 3; a plurality of projections 4 integrally formed with the substrate 3 on the heat-dissipation surface (upper side in FIG. 2) of the substrate 3; and a molded frame (wall) 5 integrally formed with the substrate 3 to surround the projections 4. Each of the projections 4 is either columnar or frustoconical. A circular molded hole 6 is formed on each corner of the substrate 3.

The substrate 3 is also provided with a contacting surface 7 which is the opposite side of the heat-dissipation surface (lower side in FIG. 2), and the contacting surface 7 is brought into contact with the semiconductor chip 12, namely, the heat generating component.

The contacting surface 7 is surface treated, and in the present embodiment, a plated layer (coating layer) 8 is formed on the contacting surface 7. The plated layer 8 is provided for the purpose of obtaining bonding function between the contacting surface 7 and the semiconductor chip 12 or function for assisting the bonding function therebetween. Examples of the function for assisting the bonding function include a function for improving adhesion of the adhesive layer 15 (which will be described later) with the heat sink 1.

The plated layer 8 can be formed from silver plating; silver-alloy plating such as silver-palladium alloy plating or silver-gold alloy plating; gold plating or gold alloy-plating; platinum plating or platinum alloy plating; nickel plating or nickel alloy plating; or chromium plating or chromium alloy plating, or the like. Among these, the preferred is the plating of a precious alloy such as silver, gold or platinum or an alloy containing such metal as its main component, and silver or silver alloy plating is particularly preferred.

The plated layer 8 may have any desired thickness. Preferably, the plated layer 8 is deposited to a thickness of about 0.5 to 20 μm, and more preferably, to a thickness of about 1 to 10 μm.

It should be noted that, the plated layer 8 may be formed on all surfaces of the heat sink main body 2. In this connection, it is also to be noted that the purposes of forming the coating layer such as a plating layer are not limited to those described above. The coating layer may be provided for forming a protective layer or improving the corrosion resistance.

The surface treatment is not limited to the above-described plating. Examples of other surface treatments includes formation of resin coating layer or painting of black paint or the like. In the latter case, the paint is applied to the heat-dissipation surface of the substrate 3.

The heat sink 1 as describe above is mounted in an IC package 10 as shown in FIG. 4.

More specifically, the IC package 10 comprises a lead frame 11, a semiconductor chip (an IC chip) 12 mounted on the lead frame 11, bonding wires (gold wire) 13 connecting predetermined terminals of the semiconductor chip and predetermined leads of the lead frame 11. The heat sink 1 is mounted on the upper surface (the upper side in FIG. 4) of the lead frame 11 with an intervening insulation layer 14. The upper surface of the semiconductor chip 12 is in contact with the contacting surface 7 of the heat sink 1 through an intervening adhesive layer 15.

Examples of the adhesive which can be used to constitute the adhesive layer 15 include an adhesive (in particular, an epoxy adhesive) containing a silver paste (at a typical silver content of about 65 to 75% by weight).

The central portion of the lead frame 11, the semiconductor chip 12, the bonding wires 13, the insulation layer 14, the adhesive layer 15 and the heat sink 1 are accommodated in the packaging material 16. The packaging material is for example formed from a molded resin such as an epoxy resin or a ceramic. The projections 4 of the heat sink 1 are exposed from the surface of the packaging material 16 to enable a highly efficient heat dissipation.

Next, the materials used for constituting the heat sink main body 2 (the sintered compact of the present invention) are described.

The heat sink main body 2 is constructed from a sintered compact formed from metal powders. With regard to the metal composition of the sintered compact, it comprises (i) at least one metal selected from tungsten and molybdenum and 2 to 50% by weight of silver; or (ii) at least one metal selected from tungsten and molybdenum, 2 to 50% by weight of silver, and not more than 10% by weight of a transition metal.

Tungsten (W) is a metal material having a low thermal expansion coefficient. Tungsten prevents the semiconductor chip from becoming cracked when the tungsten-containing heat sink 1 is adhered to the semiconductor chip 12 which comprises silicon having a low thermal expansion coefficient and even when temperature difference is generated between the heat sink 1 and the semiconductor chip 12. Molybdenum (Mo) has a series of properties similar to those of the above-described tungsten (W). Therefore, either of tungsten or molybdenum may be used for the primary component, and one may be used as a substitute for the other as desired.

Silver (Ag) is a metal material having a high thermal conductivity, and addition of silver in the sintering material would result in an improved thermal conductivity, and hence, in an improved heat dissipation of the heat sink 1. Compared to the addition of copper, addition of the silver in the sintering material would enable the sintering compact to maintain a sintering density at a high level while lowering a porosity thereof. The addition of silver also results in an improved adhesion of the above-described plating layer 8 to the heat sink 1, especially when the plating layer 8 comprises silver or a silver alloy.

The content of the silver is generally in the range of 2 to 50% by weight, preferably in the range of 5 to 40% by weight, and more preferably in the range of 10 to 25% by weight. When the silver content is less than 2% by weight, improvement of the thermal conductivity will be insufficient, and the sintered compact will also have a high porosity resulting in an insufficient mechanical strength. When the silver content is in excess of 50% by weight, the sintered compact will have an excessively high thermal expansion coefficient and therefore the difference in the thermal expansion coefficient with the silicon constituting the semiconductor chip 12 would be increased to result in such problems as cracking of the semiconductor chip 12.

The silver content may be partly substituted with copper (Cu). Since copper is less expensive than silver, so that the production cost of the sintered compact can be reduced. The substitution of the silver content with copper is limited to the half of the silver content on weight basis. Preferably, it is limited to up to 40%, and more preferably, to up to 20%. An excessive substitution with the copper would result in an increased porosity, and hence, in a reduced mechanical strength of the sintered compact. Thermal conductivity of the sintered compact is also likely to become reduced.

Typical transition metals that can be incorporated in the sintering material are those of group VII, for example, iron (Fe), nickel (Ni), and cobalt (Co) and the like, which may be used alone or in combination of two or more. Most preferably, the transition metal is at least one metal selected from iron, nickel and cobalt.

The addition of the transition metal contributes for the reduction of the porosity of the sintered compact, improvement in the adhesion of the plated layer 8 to the heat sink main body 2, and prevention of alternation (tarnishing) of the plated layer 8, and lowering in the sintering temperature.

The content of the transition metal(s) is generally up to (not more than) 10% by weight, preferably up to 5% by weight, and more preferably up to 3% by weight. The transition metal content in excess of 10% by weight will result in a reduced thermal conductivity of the sintered compact to the level insufficient for a heat sink.

The material constituting the heat sink main body 2 may also contain at least one member selected from phosphorus (P), tin (Sn), lead (Pb), chromium (Cr), palladium (Pd), zirconium (Zr), aluminum (Al), titanium (Ti), manganese (Mn) and niobium (Nb) in addition to the above-described metal elements. For example, addition of phosphorus has an effect of reducing the sintering temperature. The phosphorus can be added in the form of a compound or an alloy with the above-described transition metal or other metal.

It is preferred that the metal sintered compact constituting the heat sink main body 2 as described above has a thermal conductivity of at least 140 $W \cdot m^{-1} \cdot K^{-1}$ (at a temperature of 20° C.), more preferably, a thermal conductivity of at least 160 $W \cdot m^{-1} \cdot K^{-1}$ (at a temperature of 20° C.) and most preferably, a thermal conductivity of at least 200 $W \cdot m^{-1} \cdot K^{-1}$ (at a temperature of 20° C.). When the thermal conductivity (at a temperature of 20° C.) is less than 140 W·m$^{-1}$·K$^{-1}$, the resulting sintered compact will exhibit an insufficient heat dissipation when the sintered compact is applied to a heat sink for cooling a semiconductor chip-cooling as in the case of the present embodiment.

In addition, the metal sintered compact constituting the heat sink main body 2 may preferably have a thermal expansion coefficient of up to (not more than) 12×10$^{-6}$ K$^{-1}$, more preferably, a thermal expansion coefficient of up to 10×10$^{-6}$ K$^{-1}$, and most preferably, a thermal expansion coefficient of 5×10$^{-6}$ K$^{-1}$ to 8×10$^{-6}$ K$^{-1}$. When a sintered compact having the thermal expansion coefficient in excess of 12×10$^{-6}$ K$^{-1}$ is used for the semiconductor chip-cooling heat sink as in the case of the present embodiment, difference in the thermal expansion coefficient with the silicon constituting the semiconductor chip 12 will be increased, which results in an increased occurrence of cracking of the semiconductor chip 12.

With regard to the porosity, it is preferred that the metal sintered compact constituting the heat sink main body 2 has a porosity of up to (not more than) 10%, more preferably, a porosity of up to 7%, and most preferably, a porosity of up to 5%. An excessively high porosity will result in a reduced mechanical strength (i.e. brittleness) and hence, in a reduced reliability of the heat sink since the heat sink is more susceptible to breakage by impact or the like. An excessively high porosity will also result in a reduced thermal conductivity, and hence, in a reduced heat dissipation.

A high porosity will also result in a reduced adhesion of the plated layer 8 to the heat sink main body 2. One estimated reason for such reduced adhesion of the plated layer 8 is the plating solution remaining in the pores in the course of plating.

The shape and the structure of the heat sink according to the present invention are not limited to the one shown in the drawings. For example, the heat sink main body 2 may have any desired overall contour, and the heat dissipation projections 4 of any desired geometry may be arranged in any desired arrangement.

Next, the method for producing the heat sink of the present invention will be described based on one typical example thereof.

[1] Production of a Green Body (First step)

The green body to be sintered is preferably produced by metal injection molding (MIM). MIM has a merit that can produce a sintered compact of complicated, intricate geometry at a high dimensional precision, so that its merit is fully exhibited in the production of the sintered compact of the present invention and therefore it is particularly preferred to the present invention. The steps of the production of the sintered compact utilizing MIM are hereinafter described.

(A-1) Metal powders of the combination capable of finally obtaining the sintered compact having the composition as described above and a binder (an organic binder) were prepared, and then they were mixed or kneaded by a kneading machine to obtain a compound.

When a W-Ag alloy, a W-Mo-Ag alloy or a Mo-Ag alloy is produced, powder of these alloys; a mixture of W powder and Ag powder; a mixture of W powder, Mo powder and Ag powder; a mixture of W powder and Mo-Ag alloy powder; a mixture of Mo powder and Ag powder; a mixture of Mo powder and W-Ag alloy powder; or a combination of any of the foregoing may be used.

When a W-Ag-Cu alloy, a W-Mo-Ag-Cu alloy or a Mo-Ag-Cu alloy is produced, Cu or Cu alloy in the form of Cu powder or an alloy Cu powder may be added to the above-mentioned alloy or metal powder mixture.

When a W-Ag-transition metal alloy, a W-Mo-Ag-transition metal transition metal alloy, a Mo-Ag-transition metal alloy, W-Ag-Cu-transition metal alloy, a W-Mo-Ag-Cu-transition metal alloy or a Mo-Ag-Cu-transition metal alloy is produced, the one or more transition metal or an alloy thereof in the form of a metal or an alloy powder may be added to the above-mentioned alloy or metal powder mixture.

When a metal element other than the W, Mo, Ag, Cu or the transition metal is added, such metal element in the form of an alloy powder or a metal powder may be added to the above-mentioned alloy or metal powder mixture.

Namely, the elements added may be in the form of an alloy powder or the metal powder of any desired combination.

The metal powder may have any desired average particle size. The particle size, however, is generally in the range of about 0.2 to 20 μm, and preferably, in the range of about 1 to 50 μm.

Exemplary binders which may be used in the present invention include polyolefins such as polyethylene, polypropyrene, and ethylene-vinyl acetate copolymer; acryl resins such as polymethyl (meth)acrylate and polybutyl (meth)acrylate; styrene resins such as polystyrene; polyvinyl chloride, polyvinylidene chloride, polyamide, polyesters, polyether, polyvinyl alcohol, copolymers thereof, and other resins, waxes, paraffins, higher fatty acids such as stearic acid, higher alcohols, higher fatty acid esters, higher fatty acid amides, and the like, which may be used alone or in combination of two or more.

The compound may further comprise a plasticizer. Typical plasticizers are phthalates such as DOP, DEP, and DBP, agipate, trimeritate, and sebasate, which may be used alone or in combination or two or more.

The total content of such binder in the compound is preferably in the range of 2 to 25% by weight, and more preferably, in the range of 3 to 15% by weight. The binder content of less than 2% by weight will result in an insufficient fluidity of the compound, and the injection molding would be impossible to carry out or the resulting green body will have an inconsistent composition. The binder content of more than 25% by weight will result in an increased sintering shrinkage leading to reduced dimensional precision, and the sintered compact will also suffer from an increased porosity as well as an increased carbon content.

In the preparation of the compound, a lubricant, an antioxidant, a debinding accelerator, a surfactant, and other additives may be added as desired in addition to the metal powders, the binder, and the plasticizer as described above.

The conditions of the mixing may vary according to the conditions such as the particle size of the metal powders employed, type and content of the binder and the additives, and the like. The materials may be mixed, for example, at a temperature in the range of from room temperature to about 200° C. for about 20 to 210 minutes.

(A-2) The compound produced in step (A-1) (or the pellets prepared therefrom) was used for the injection molding in an injection molding machine to produce the green body of the desired shape. The green body having projections 4 of small, intricate shape can be readily prepared by an adequate selection of the mold.

The conditions of the injection molding may vary according to the particle size of the metal powders employed, type and content of the binder, and the like. The injection molding may be effected, for example, at a material temperature preferably in the range of from about 80 to 200° C. and an injection pressure preferably in the range of about 20 to 150 kgf/cm$^2$.

[2] Debinding of the Green Body (Second step)

The green body produced in the above-described step [1] is subjected to debinding, wherein the green body is thermally treated in a non-oxidizing atmosphere, for example, under vacuum or at a reduced pressure (typically in the range of $1\times10^{-1}$ to $1\times10^{-6}$ Torr) or in an inert atmosphere such as nitrogen gas or argon gas.

The thermal treatment is preferably conducted at a temperature of about 100 to 750° C. for about 0.5 to 40 hours, and more preferably, at a temperature of about 150 to 600° C. for 1 to 24 hours.

The debinding by thermal treatment may be carried out in a plurality of steps or stages depending on the particular purpose. For reducing the period of debinding, the debinding may be carried out in two stages wherein the former stage is carried out at a relatively low temperature, and the latter stage is carried out at a relatively high temperature.

Alternatively, the debinding may be effected by dissolving particular component(s) in the binder or the additives with an adequate medium, which may be either a liquid or a gas.

[3] Sintering of the Brown Body (Third step)

The brown body (debound body) is sintered in a sintering furnace to prepare the metal sintered compact.

The sintering is preferably carried out at a sintering temperature of about 1000 to 1450° C., and more preferably, about 1100 to 1380° C.

A higher sintering temperature is favorable for reducing the period of sintering. An excessively high temperature, however, is deleterious for the sintering furnace and supporting parts and may shorten their life. In particular, when copper is present in the brown body, the copper in the brown body will be splashed during sintering to deposit on the interior walls of the sintering furnace or the support of the brown body.

It should be noted that the sintering temperature may vary (increase or decrease) within or beyond the above-mentioned temperature range with lapse of time.

The sintering time is preferably set not longer than 10 hours for preventing the productivity from being lowered. In particular, when the sintering is carried out within the above-mentioned temperature range, the sintering is preferably conducted for about 0.5 to 8 hours, more preferably for about 1 to 5 hours, and most preferably for about 1 to 3.5 hours.

The sintering atmosphere is preferably a non-oxidizing atmosphere free from hydrogen, which improves safety during the sintering and reduces porosity of the resulting sintered compact.

Typically, it is preferable to effect the sintering under vacuum or at a reduced pressure of $1\times10^{-2}$ Torr or less (and more preferably, at a pressure in the range of $1\times10^{-2}$ Torr to $1\times10^{-6}$ Torr) or in an inert atmosphere such as nitrogen gas or argon gas.

It should be noted that the sintering atmosphere may be altered during the sintering, for example, from the reduced pressure (vacuum) of $1\times10^{-2}$ Torr to $1\times10^{-6}$ Torr to an inert atmosphere as mentioned above.

When the sintering is effected under the above-described conditions, the resulting sintered compact will have a reduced porosity, and the sintering efficiency will be improved to result in a shortened sintering period. Safety in the sintering operation and productivity will also be improved.

In the present invention, the sintering may be effected in two or more stages, for example, in two stages of different sintering conditions. In such a case, the second sintering may be effected at a higher sintering temperature than the first sintering so as to improve the sintering efficiency and reduce the porosity of the sintered compact.

[4] Surface Treatment (Fourth step)

The sintered compact (heat sink main body 2) obtained in step [3], above is surface treated at least on its contacting surface 7 which will be in contact with the semiconductor chip 12. The surface treatment of the present embodiment is plating (i.e. deposition of the plated layer 8). The surface treatment, however, is not limited to such plating, and examples of such surface treatments include grinding, polishing, resin coating, and coating, which may be conducted alone or in combination of two or more.

The plating in this embodiment is carried out for the purpose of providing bonding function to the contacting surface 7 with the semiconductor chip 12 or assisting such function.

The plating may be conducted, for example, by wet plating such as electroplating, dipping, or electroless plating; or by gaseous plating such as vapor deposition, sputtering, ion plating, or CVD.

As described above, the method for producing a sintered compact of the present invention enables a safe and efficient production of high-quality heat sinks (heat dissipators) exhibiting low porosity (i.e. high sintering density), high strength, high hardness, and excellent heat dissipation. The heat sinks produced are uniform in their shape with high dimensional precision.

The present invention is hereinafter described in further detail with reference to Examples of the invention and Comparative Examples.

EXAMPLES

Examples 1 to 30 and Comparative Examples 1 to 6

Of the eight types of metal powders shown below, the powders necessary for constituting the final composition as shown in Table 1 were blended in respective Examples and Comparative Examples.

W powder: average particle size, 4 μm

Mo powder: average particle size, 5 μm

Ag powder: average particle size, 1 μm

Cu powder: electrolytic powder, average particle size, 6 μm

Fe powder: carbonyl powder, average particle size, 4 μm

Ni powder: carbonyl powder, average particle size, 6 μm

Co powder: electrolytic powder, average particle size, 1.5 μm

P powder: ferrophosphor powder, average particle size, 4 μm

To the metal powders as described above were added binders of 1.5% by weight of polystyrene (PS), 1.5% by weight of ethylene-vinyl acetate copolymer (EVA) and 1.2% by weight of paraffin wax; and a plasticizer of 0.7% by weight of dibutyl phthalate, and these materials were mixed in a kneading machine (pressurized kneader) at 110° C. for 1 hour to produce the compound.

The compound was injection molded in an injection molding machine to produce a green body for a heat sink having the shape as shown in FIGS. 1 and 2. The green body had a size that would result in the finished sintered compact of the overall size of 25 mm×25 mm with the projections each having the outer diameter of 1.25 mm and the height of 1 mm. It should be noted that the size of the green body is somewhat larger than the size of the sintered compact in consideration of the shrinkage during the sintering.

The injection molding was conducted under such conditions that the mold temperature was about 30° C. and the injection pressure was 110 kgf/cm².

Next, the resulting green body was debound at a reduced pressure of $1\times10^{-3}$ Torr at about 400° C. for 1 hour.

Next, the debound brown body (of the weight of about 4 kg) was sintered in a sintering furnace to produce the sintered compact. The sintering was carried out under the following conditions:

Examples 1, 4, 7 to 14, 21, 23, and Comparative Examples 1 to 5 sintering temperature: 1350° C.

sintering period: 2 hours sintering atmosphere: argon gas

Examples 2, 3, 15 to 17, and Comparative Example 6 sintering temperature: 1200° C.

sintering period: 2 hours sintering atmosphere: argon gas

Examples 5, 6, 18 to 20, 22, and 24 sintering temperature: first sintering, 1000° C. second sintering, 1200° C.

sintering period: 2 hours sintering atmosphere: first sintering, at a reduced pressure of $1\times10^{-3}$ Torr second sintering, nitrogen gas

Examples 25 to 30 sintering temperature: first sintering, 1050° C. second sintering, 1180° C.

sintering period: 2 hours sintering atmosphere: first sintering, at a reduced pressure of $1\times10^{-3}$ Torr second sintering, argon gas Next, the resulting heat sink sintered compact was electroplated on all surfaces with silver. The plated layer had a dry film thickness of 1 μm. The surfaces of the heat sink which would not be in contact with the semiconductor chip were then deposited with a black coating to complete the heat sink for cooling a semiconductor chip.

The heat sinks obtained in the above-described Examples 1 to 30 and Comparative Examples 1 to 6 were evaluated for their sintered density ratio, porosity, thermal conductivity (temperature, 20° C.), thermal expansion coefficient, mechanical strength (breakage rate), and plating adhesion. The results are shown in the attached Tables 1 to 3.

TABLE 1

| | Composition [wt %] | | | | | | | | Density ratio [%] | Porosity [%] | Thermal conductivity [W·m$^{-1}$·K$^{-1}$] | Thermal expansion coefficient × 10$^{-6}$ [K$^{-1}$] | Breakage rate [%] | Plating adhesion |
|---|---|---|---|---|---|---|---|---|---|---|---|---|---|---|
| | W | Mo | Ag | Cu | Fe | Ni | Co | P | | | | | | |
| Example 1 | 92 | — | 8 | — | — | — | — | — | 95.8 | 4.2 | 195 | 5.7 | 1 | ○ |
| Example 2 | 74 | — | 20 | — | 1 | 3 | 1 | 1 | 98.2 | 1.8 | 190 | 7.9 | 0 | ⊙ |
| Example 3 | — | 88 | 10 | — | — | — | 2 | — | 97.6 | 2.4 | 189 | 6.7 | 0 | ⊙ |
| Example 4 | 45 | 45 | 10 | — | — | — | — | — | 96.0 | 4.0 | 210 | 6.3 | 1 | ○ |
| Example 5 | 55 | 25 | 15 | — | 3 | — | 2 | — | 97.9 | 2.1 | 185 | 7.3 | 0 | ⊙ |
| Example 6 | 35 | 50 | 11 | — | 1 | 2 | — | 1 | 97.7 | 2.3 | 183 | 6.7 | 0 | ⊙ |
| Example 7 | 98 | — | 1.5 | 0.5 | — | — | — | — | 95.0 | 5.0 | 162 | 4.8 | 4 | ○ |
| Example 8 | 97.5 | — | 2 | 0.5 | — | — | — | — | 95.1 | 4.9 | 170 | 4.9 | 3 | ○ |
| Example 9 | 89.9 | — | 10 | 0.1 | — | — | — | — | 96.2 | 3.8 | 210 | 6.1 | 1 | ○ |
| Example 10 | 80 | — | 10 | 10 | — | — | — | — | 95.2 | 4.8 | 233 | 7.3 | 2 | ○ |
| Example 11 | 81 | — | 15 | 4 | — | — | — | — | 96.0 | 4.0 | 250 | 7.3 | 1 | ⊙ |
| Example 12 | 75 | — | 15 | 10 | — | — | — | — | 96.3 | 3.7 | 276 | 8.0 | 2 | ⊙ |

TABLE 2

| | Composition [wt %] | | | | | | | | Density ratio [%] | Porosity [%] | Thermal conductivity [W·m$^{-1}$·K$^{-1}$] | Thermal expansion coefficient × 10$^{-6}$ [K$^{-1}$] | Breakage rate [%] | Plating adhesion |
|---|---|---|---|---|---|---|---|---|---|---|---|---|---|---|
| | W | Mo | Ag | Cu | Fe | Ni | Co | P | | | | | | |
| Example 13 | 60 | — | 30 | 10 | — | — | — | — | 96.4 | 3.6 | 328 | 10.3 | 1 | ⊙ |
| Example 14 | 50 | — | 45 | 5 | — | — | — | — | 96.5 | 3.5 | 375 | 11.9 | 1 | ⊙ |
| Example 15 | 82.5 | — | 15 | 2 | 0.5 | — | — | — | 97.1 | 2.9 | 240 | 7.1 | 0 | ⊙ |
| Example 16 | 78 | — | 15 | 2 | — | 5 | — | — | 98.0 | 2.0 | 158 | 7.5 | 0 | ⊙ |
| Example 17 | 81 | — | 15 | 2 | — | — | 2 | — | 97.2 | 2.8 | 194 | 7.2 | 0 | ⊙ |
| Example 18 | 75 | — | 15 | 4 | 1 | 5 | — | — | 98.3 | 1.7 | 155 | 7.8 | 0 | ⊙ |
| Example 19 | 66 | — | 20 | 4 | — | 5 | 5 | — | 97.0 | 3.0 | 142 | 8.9 | 0 | ⊙ |
| Example 20 | 66 | — | 20 | 4 | 3 | 5 | 2 | — | 97.9 | 2.1 | 140 | 8.9 | 0 | ⊙ |
| Example 21 | 60 | 20 | 10 | 10 | — | — | — | — | 96.6 | 3.4 | 228 | 7.4 | 2 | ○ |
| Example 22 | 38 | 38 | 15 | 2 | 2 | 5 | — | — | 96.8 | 3.2 | 146 | 7.8 | 0 | ⊙ |
| Example 23 | — | 80 | 10 | 10 | — | — | — | — | 95.5 | 4.5 | 225 | 7.8 | 2 | ○ |
| Example 24 | — | 75 | 15 | 4 | 1 | 5 | — | — | 98.2 | 1.8 | 150 | 8.2 | 0 | ⊙ |

TABLE 3

| | Composition [wt %] | | | | | | | Density ratio [%] | Porosity [%] | Thermal conductivity [W·m$^{-1}$·K$^{-1}$] | Thermal expansion coefficient × 10$^{-6}$ [K$^{-1}$] | Breakage rate [%] | Plating adhesion |
|---|---|---|---|---|---|---|---|---|---|---|---|---|---|
| | W | Mo | Ag | Cu | Fe | Ni | Co | P | | | | | | |
| Example 25 | 55 | 5 | 22 | 10 | 3 | 2 | 2 | 1 | 98.3 | 1.7 | 150 | 9.6 | 0 | ⊚ |
| Example 26 | 45 | 15 | 22 | 10 | 3 | 2 | 2 | 1 | 98.3 | 1.7 | 148 | 9.7 | 0 | ⊚ |
| Example 27 | 30 | 30 | 22 | 10 | 3 | 2 | 2 | 1 | 98.0 | 2.0 | 147 | 9.8 | 0 | ⊚ |
| Example 28 | 18 | 42 | 22 | 10 | 3 | 2 | 2 | 1 | 98.2 | 1.8 | 146 | 9.9 | 0 | ⊚ |
| Example 29 | 10 | 50 | 22 | 10 | 3 | 2 | 2 | 1 | 98.1 | 1.9 | 145 | 9.9 | 0 | ⊚ |
| Example 30 | 5 | 55 | 22 | 10 | 3 | 2 | 2 | 1 | 98.2 | 1.8 | 145 | 9.9 | 0 | ⊚ |
| Comp. Ex. 1 | 90 | — | — | 10 | — | — | — | — | 89.4 | 10.6 | 135 | 5.8 | 10 | X |
| Comp. Ex. 2 | 65 | 25 | — | 10 | — | — | — | — | 89.1 | 10.9 | 133 | 5.9 | 11 | X |
| Comp. Ex. 3 | 99 | — | 0.5 | 0.5 | — | — | — | — | 84.9 | 15.1 | 150 | 4.6 | 12 | X |
| Comp. Ex. 4 | 42 | — | 51 | 7 | — | — | — | — | 95.5 | 4.5 | 376 | 16.3 | 1 | ○ |
| Comp. Ex. 5 | — | 45 | 25 | 30 | — | — | — | — | 92.7 | 7.3 | 265 | 12.5 | 8 | Δ |
| Comp. Ex. 6 | — | 60 | — | 15 | 15 | 5 | 5 | — | 94.5 | 5.5 | 90 | 8.8 | 4 | Δ |

The porosity was calculated from the density ratio measured by Archimedean method.

The thermal conductivity was measured by a method (laser flash method) in which one surface of the disk-shaped sample was uniformly flashed with laser and the other surface was measured for temperature alteration with lapse of time to determine the thermal conductivity.

The thermal expansion coefficient was measured by the method in which a push bar was placed in contact with one end of the columnar sample, and the elongation of the sample with the temperature increase was measured as a displacement of the push bar. The coefficient of the thermal expansion was calculated by the following equation (I):

$$\text{Thermal expansion coefficient} = \frac{\left(\frac{L_{100°C.} - L_{30°C.}}{L_{30°C.}}\right)}{100 - 30} \quad (I)$$

here, $L_{30°\,C.}$ is the length of the sample at 30° C., and $L_{100°\,C.}$ is the length of the sample at 100° C.

The mechanical strength was evaluated in terms of breakage rate when the heat sink (50 heat sinks per each type) was dropped onto an oak floor from the height of 1 m. After dropping the heat sink onto the oak floor, the heat sink was checked for its breakage near the mold hole 6, which is the part most likely to be broken, and the breakage rate was calculated from the number of the broken heat sinks. The product with the breakage rate of 5% or more was deemed non-reliable and rejected.

The plating adhesion was evaluated by a crosscut adhesion test in which an adhesive tape was attached onto the sample having crosscuts formed in the plated layer at an interval of 1 mm, and the adhesive tape was peeled off the sample to determine the number of 1 mm×1 mm square pieces that were peeled. The plating adhesion was evaluated in four ranks, namely, (⊚, ○, Δ, and × from the fewer number of the peeled pieces to the greater number of the peeled pieces.

As shown in the attached Tables, the heat sinks of Examples 1 to 30 exhibited high thermal conductivity, low thermal expansion coefficient, low porosity of 5% or less, high mechanical strength (low breakage rate in dropping test), and high plating adhesion. The heat sinks of Examples 1 to 30 also had uniform shapes with high dimensional precision.

In Examples 2, 3, 5, 6, 15 to 20, 22, and 24 to 30 wherein a transition metal and/or P was used, the heat sinks having such advantages could be produced at a lower sintering temperature.

In contrast, the heat sinks of Comparative Examples 1 to 3 suffered from high porosity, low mechanical strength, and inferior plating adhesion. The heat sink of Comparative Example 4 suffered from a high thermal expansion coefficient. The heat sink of Comparative Example 5 suffered from an inferior mechanical strength. The heat sink of Comparative Example 6 suffered from a low thermal conductivity. These heat sinks were also inferior in their plating adhesion.

BENEFITS OF THE INVENTION

As described above, the present invention is capable of providing a sintered compact of high quality which exhibits low porosity, high strength and difficult to be broken and excellent in heat dissipation ability, and which has uniform configuration with high dimensional precision. The present invention is also capable of providing a sintered compact having an excellent plating adhesion. Therefore, the parts such as an IC package having the heat sink of the present invention mounted have a markedly improved reliability.

The present invention also enables easy, safe, and efficient production of the sintered compacts having the above-mentioned excellent properties, and therefore, the productivity is improved and the production cost is reduced.

Finally, it should be noted that the present invention is not limited to the embodiments and examples described above, and many changes and modifications can be made within the spirit and scope of the present invention which are determined by the following claims.

What is claimed is:

1. A sintered compact for use in a heat dissipater, said sintered compact formed from metal powders using a metal injection molding, said sintered compact having a metal composition and formed at a sintering temperature comprising:

at least one material selected from the group consisting of tungsten and molybdenum; and 2 to 50% by weight of silver wherein the metal composition includes phosphorous in an amount effective to lower the sintering temperature.

2. The sintered compact according to claim 1, wherein said sintered compact further comprises not more than 10% by weight of a transition metal.

3. The sintered compact according to claim 2, wherein said transition metal is at least one metal selected from the group consisting of Fe, Ni and Co.

4. The sintered compact according to claim 1, wherein a part of said silver content in said sintered compact which is not more than 50% is substituted with copper.

5. The sintered compact according to claim 1, wherein said sintered compact has a thermal conductivity of at least 140 $W \cdot m^{-1} \cdot K^{-1}$ at a temperature of 20° C.

6. The sintered compact according to claim 1, wherein said sintered compact has a thermal expansion coefficient of $12 \times 10^{-6}$ $K^{-1}$ or less.

7. The sintered compact according to claim 1, wherein said sintered compact has a porosity of 10% or less.

8. The sintered compact according to claim 1, wherein said sintered compact is used for a heat sink for cooling a semiconductor chip.

9. The sintered compact according to claim 1, wherein said sintered compact having a contacting surface adapted to contact with a heat generating component, and a coating layer is formed on said contacting surface of said sintered compact.

10. The sintered compact according to claim 9, wherein said coating layer is provided for the purpose of providing bonding between said sintered compact and the heat-generating component or assisting such bonding therebetween.

11. The sintered compact according to claim 9, wherein said coating layer is a plated layer.

12. The sintered compact according to claim 11, wherein said plated layer includes silver or silver alloy.

13. The sintered compact according to claim 1, wherein the sintered compact has a metal composition of 5 to 40% by weight of silver.

14. The sintered compact according to claim 1, wherein the sintered compact has a metal composition of 10 to 25% by weight of silver.

15. A sintered compact according to claim 1 wherein the metal composition and an organic binder are combined to form a compound, the compound subsequently being subjected to a metal injection molding process to form a green body having a defined shape, the green body subsequently being subjected to a debinding treatment for removing the organic binder to form a brown body, and the brown body subsequently being sintered to form the sintered compact.

16. The sintered compact according to claim 15, wherein the binder is in a range of 2 to 25% by weight of the compound.

17. The sintered compact according to claim 15, wherein the sintered compact has a single layer structure formed in a single sintering process.

18. A heat sink formed from metal powders, said heat sink comprising:
   a metal composition formed of at least one material selected from the group consisting of tungsten and molybdenum, and further formed of 2 to 50% by weight of silver wherein the metal composition and an organic binder are combined to form a compound, the compound is subjected to a metal injection molding process to form a green body having a defined shape, the green body being subsequently subjected to a debinding treatment for removing the organic binder to form a brown body, and the brown body being subsequently subject to a sintering process at a sintering temperature to form the heat sink wherein the metal composition includes phosphorous in an amount effective to lower the sintering temperature.

19. A heat sink according to claim 18, wherein the binder is in a range of 2 to 25% by weight of an overall composition of the compound formed of the organic binder and the metal composition prior to subjecting the compound to the metal injection molding process.

20. The heat sink according to claim 18, wherein said heat sink has a porosity of 10% or less.

21. The heat sink according to claim 18, wherein the heat sink has a single layer structure formed in a single sintering process.

* * * * *